United States Patent
Mok et al.

(10) Patent No.: US 7,385,227 B2
(45) Date of Patent: Jun. 10, 2008

(54) COMPACT LIGHT EMITTING DEVICE PACKAGE WITH ENHANCED HEAT DISSIPATION AND METHOD FOR MAKING THE PACKAGE

(75) Inventors: Thye Linn Mok, Penang (MY); Ju Chin Poh, Penang (MY); Siew It Pang, Penang (MY)

(73) Assignee: Avago Technologies ECBU IP Pte Ltd, Singapore (SG)

( * ) Notice: Subject to any disclaimer, the term of this patent is extended or adjusted under 35 U.S.C. 154(b) by 371 days.

(21) Appl. No.: 11/104,282

(22) Filed: Apr. 12, 2005

(65) Prior Publication Data

US 2006/0226435 A1    Oct. 12, 2006

(51) Int. Cl.
*H01L 29/22* (2006.01)
*H01L 29/24* (2006.01)

(52) U.S. Cl. .................... 257/98; 257/81; 257/99; 257/100; 257/85; 257/94; 257/676; 257/692; 257/696

(58) Field of Classification Search .............. 257/98, 257/81, 99, 100, 85, 94, 676, 692, 696, 892
See application file for complete search history.

(56) References Cited

U.S. PATENT DOCUMENTS

| | | | |
|---|---|---|---|
| 6,486,543 B1* | 11/2002 | Sano et al. ............ | 257/684 |
| 6,603,148 B1* | 8/2003 | Sano et al. ............ | 257/98 |
| 6,815,249 B2 | 11/2004 | Miura | |
| 2005/0253158 A1* | 11/2005 | Yasukawa et al. ....... | 257/98 |

\* cited by examiner

*Primary Examiner*—Ken Parker
*Assistant Examiner*—Joesph Nguyen

(57) ABSTRACT

A light emitting device package and method for making the package utilizes a first leadframe having a first surface and a second leadframe having a second surface that are relatively positioned such that the second surface is at a higher level than the first surface. The light emitting device package includes a light source, e.g., a light emitting diode die, which is mounted on the first surface of the first leadframe and electrically connected to the second surface of the second leadframe.

14 Claims, 4 Drawing Sheets

COMPACT LIGHT EMITTING DEVICE PACKAGE WITH ENHANCED HEAT DISSIPATION AND METHOD FOR MAKING THE PACKAGE

BACKGROUND OF THE INVENTION

Light emitting diodes ("LEDs") have many advantages over conventional light sources, such as incandescent, halogen and fluorescent lamps. These advantages include longer operating life, lower power consumption and smaller size. Consequently, conventional light sources are increasingly being replaced with LEDs in traditional lighting applications. As an example, LEDs are currently being used in flashlights, traffic signal lights, automotive taillights and display devices.

As LEDs are used in more lighting applications, there is an increasing need to produce brighter and smaller LEDs. The brightness of an LED is partly dependent on the applied power, i.e., the applied driving current. However, an increase in the driving current correspondingly results in an increased heat generated by the die of the LED, which must be dissipated. If the generated heat is not effectively dissipated, the performance of the LED is significantly degraded, i.e., the brightness of the LED is significantly reduced. Thus, an important function of an LED package is heat dissipation to maintain an optimal operating temperature for the LED die.

Among the various packages for LEDs, an LED package of interest is the plastic leaded chip carrier (PLCC) package for a surface mount LED. Surface mount LEDs in PLCC packages may be used, for example, in automotive interior display devices, electronic signs and signals, electrical equipments and numerous other devices.

A concern with current PLCC package designs is that, in order to increase heat dissipation for higher power LEDs, the package size must be increased to handle the increased heat, or an additional piece of metal is needed to form a heat sink, which would result in an increase in the manufacturing cost of the packages.

In view of this concern, there is a need for a compact PLCC package for high power surface mount LED with enhanced heat dissipation and method for making the PLCC package.

SUMMARY OF THE INVENTION

A light emitting device package and method for making the package utilizes a first leadframe having a first surface and a second leadframe having a second surface that are relatively positioned such that the second surface is at a higher level than the first surface. The light emitting device package includes a light source, e.g., a light emitting diode die, which is mounted on the first surface of the first leadframe and electrically connected to the second surface of the second leadframe.

A light emitting device package in accordance with an embodiment of the invention comprises a first leadframe having a first surface, a light source mounted on the first surface of the first leadframe, a second leadframe having a second surface, the second surface being positioned at a higher level than the first surface, and an electrical connection between the light source and the second surface of the second leadframe.

A light emitting device package in accordance with another embodiment of the invention comprises a structural body, a first leadframe having a first surface attached to the structural body, a light emitting diode die mounted on the first surface of the first leadframe, a second leadframe having a second surface attached to the structural body, the second surface being positioned at a higher level than the first surface of the first leadframe, a reflector cup positioned over the first surface of the first leadframe such that the light emitting diode die is positioned within the reflector cup, the reflector cup including an opening to expose a portion of the second surface of the second leadframe, and a bond wire connected to the light emitting diode die and the second surface of the second leadframe.

A method for making a light emitting device package in accordance with an embodiment of the invention comprises providing first and second leadframes, the first leadframe including a first surface, the second leadframe including a second surface, attaching the first and second leadframes to a structural body such that the second surface of the second leadframe is positioned at a higher level than the first surface of the first leadframe, mounting a light source onto the first surface of the first leadframe, and electrically connecting the light source to the second surface of the second leadframe.

Other aspects and advantages of the present invention will become apparent from the following detailed description, taken in conjunction with the accompanying drawings, illustrated by way of example of the principles of the invention.

DETAILED DESCRIPTION

Figure 1:
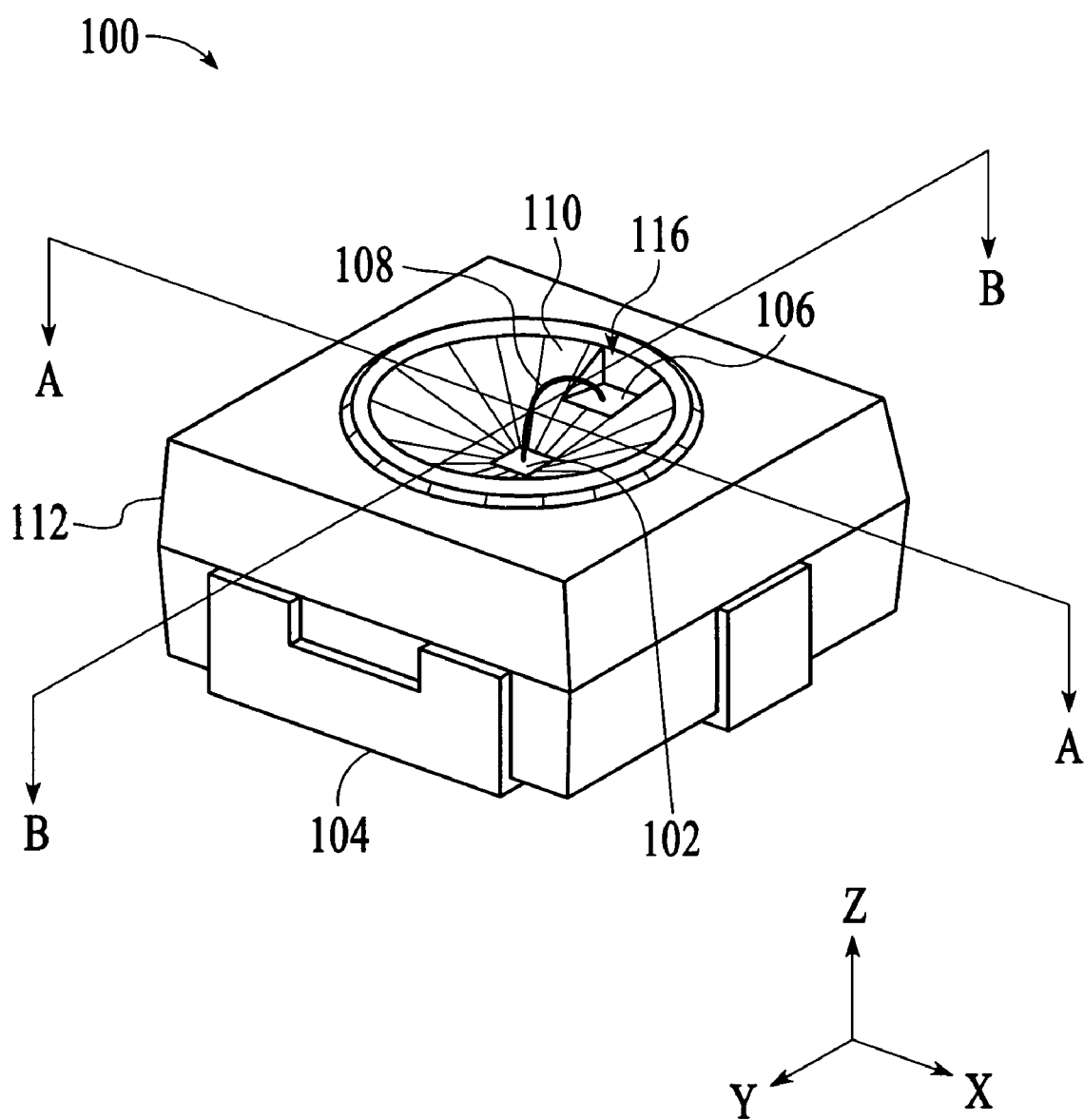
FIG. 1 is a perspective view of a light emitting diode (LED) package in accordance with an embodiment of the invention.

With reference to FIG. 1, a light emitting diode (LED) package 100 in accordance with an embodiment of the invention is described. FIG. 1 is a perspective view of the LED package 100. In this embodiment, the LED package 100 is a plastic leaded chip carrier (PLCC) package. However, the inventive features of the LED package 100 described herein may be applied to other types of packages. As described in more detail below, the LED package 100 is designed to efficiently dissipate heat generated by an LED die 102 included in the LED package without increasing the overall size of the LED package or requiring an additional piece of metal to form a heat sink, which would increase the manufacturing cost of the LED package.

The LED package 100 includes the LED die 102, leadframes 104 and 106 (partially shown in FIG. 1), a bond wire 108, a reflector cup 110, a structural body 112 and an encapsulant 114 (not shown in FIG. 1). The LED die 102 is a semiconductor chip that generates light in response to applied driving current. Thus, the LED die 102 is a light source of the LED package 100. Although the LED package 100 is shown in FIG. 1 as having only a single LED die, the LED package may include multiple LED dies. The LED die 102 is attached or mounted on the leadframe 104 using an adhesive material, and electrically connected to the other leadframe 106 via the bond wire 108.

Figure 2:
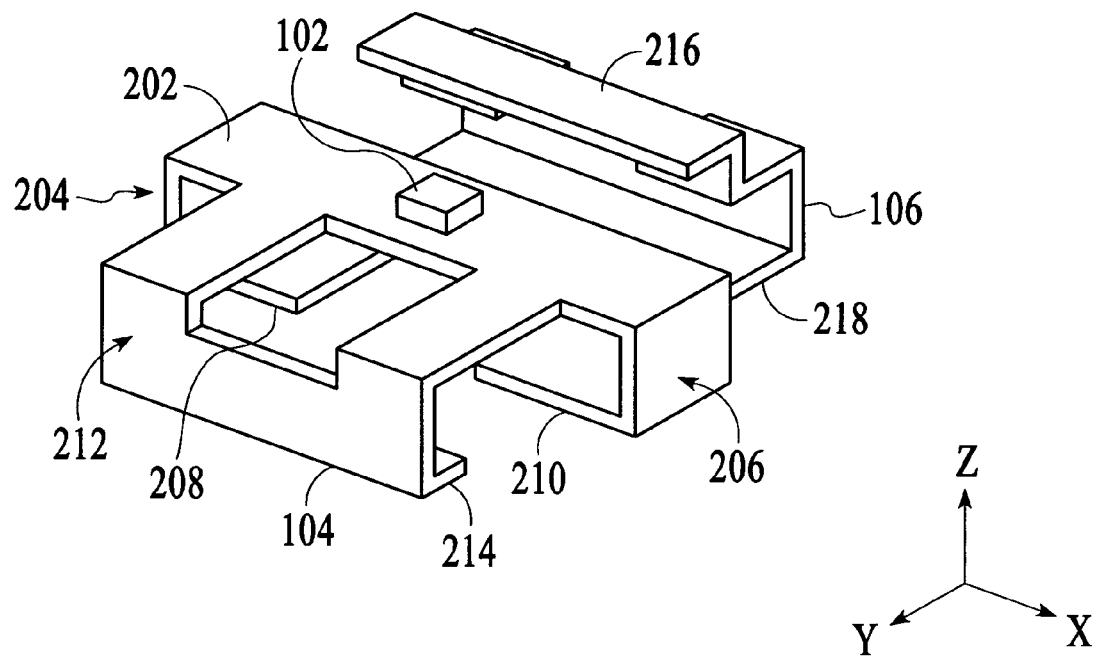
FIG. 2 is a perspective view of leadframes included in the LED package of FIG. 1 in accordance with an embodiment of the invention.
Figure 3:
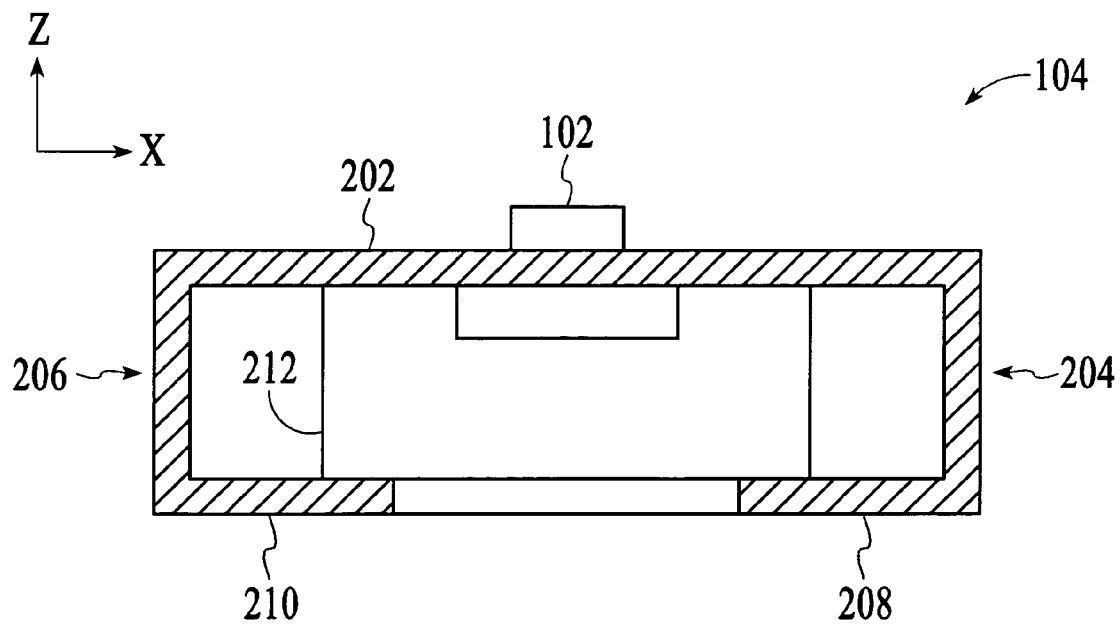
FIG. 3 is a rear view of one of the leadframes included in the LED package of FIG. 1 in accordance with an embodiment of the invention.
Figure 4:
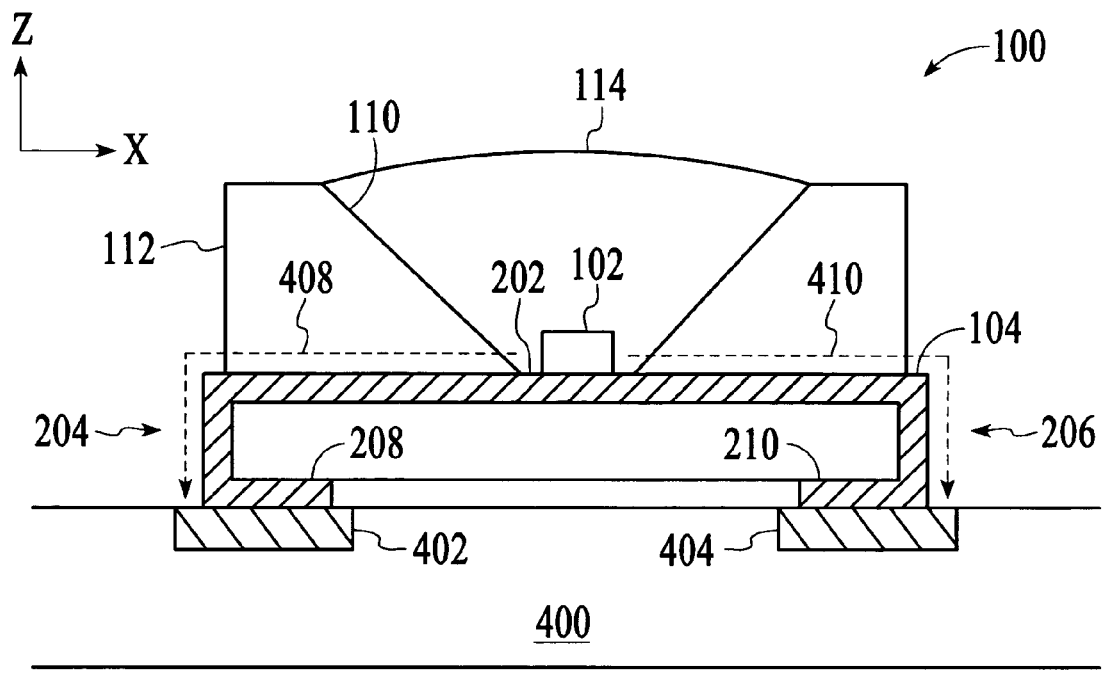
FIG. 4 is a cross-sectional view of the LED package mounted on a printed circuit board (PCB) along the line A-A shown in FIG. 1.
Figure 5:
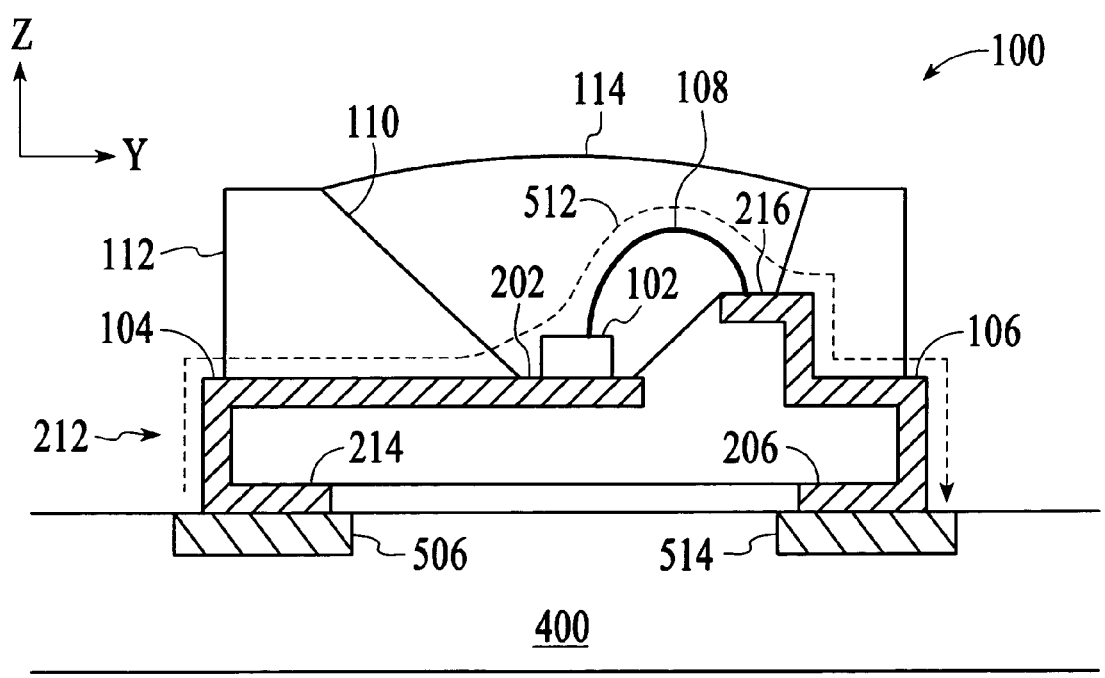
FIG. 5 is a cross-sectional view of the LED package mounted on the PCB along the line B-B shown in FIG. 1.

The leadframes 104 and 106, along with the LED die 102 mounted on the leadframe 104, are shown in FIG. 2, which is a perspective view of the leadframes and the LED die. The leadframes 104 and 106 are made of electrically and thermally conductive material, such as metal. The leadframes 104 and 106 are attached to the structural body 112 of the LED package 100. The leadframe 104 is configured to include a planar surface 202 on which the LED die 102 is mounted. The leadframe 104 is further configured to include wing-like extensions 204 and 206. These wing-like extensions 204 and 206 of the leadframe 104 extend from the mounting location of the LED die 102 on the planar surface 202 along the X-axis and are bent so that ends 208 and 210 of the wing-like extensions 204 and 206, respectively, are positioned below the planar surface 202, as illustrated in FIG. 2. The configuration of the leadframe 104 is further illustrated in FIG. 3, which is a rear view of the leadframe 104. The ends 208 and 210 of the wing-like extensions 204 and 206, respectively, form pads to thermally attach the leadframe 104 to corresponding pads 402 and 404 of a printed circuit board (PCB) 400 on which the LED package 100 can be attached, as illustrated in FIG. 4, which is a cross-sectional view of the LED package along the A-A line shown in FIG. 1. As described below, the wing-like extensions 204 and 206 of the leadframe 104 are used to direct heat generated by the LED die 102 to the PCB 400 away from the LED die. The leadframe 104 also includes a frontal extension 212, which is similar to the wing-like extensions 204 and 206. The frontal extension 212 of the leadframe 104 extends from the mounting location of the LED die 102 on the planar surface 202 along the Y-axis and is bent so that end 214 of the frontal extension is also positioned below the planar surface 202, as illustrated in FIG. 2. The end 214 of the frontal extension 212 forms another pad to electrically attach the leadframe 104 to a corresponding pad 506 of the PCB 400, as illustrated in FIG. 5, which is a cross-sectional view of the LED package 100 along the line B-B shown in FIG. 1. As described below, the frontal extension 212 of the leadframe 104 is used to direct electrical current through the LED die 102 to drive the LED die to generate light.

Similar to the leadframe 104, the leadframe 106 is configured to include a planar surface 216 on which the bond wire 108 is attached. The leadframe 106 is bent such that end 218 of the leadframe 106 is positioned below the planar surface 216 of the leadframe 106, as illustrated in FIGS. 2 and 5. As shown in FIG. 5, the planar surface 216 of the leadframe 106 is situated at a higher level along the Z-axis than the planar surface 202 of the leadframe 104. That is, the planar surface 216 of the leadframe 106 is located at a higher elevation than the planar surface 202 of the leadframe 104. The higher elevation of the planar surface 216 of the leadframe 106 is achieved by configuring the leadframe 106 such that the height of the leadframe 106 is greater than the height of the leadframe 104. Since the planar surfaces 202 and 216 of the leadframes 104 and 106 are located on the top of the respective leadframes, the height of each leadframe determines the elevation of the respective planar surfaces. This multi-level design of the leadframes 104 and 106 allows the LED package 100 to be compact, even with the inclusion of the wing-like extensions 204 and 206 that are used to dissipate heat from the LED die 102.

The reflector cup 110 of the LED package 100 is positioned over the planar surface 202 of the leadframe 104 such that the LED die 102 is located within the reflector cup, as illustrated in FIGS. 1, 4 and 5. The reflector cup 110 may be made of a molded plastic material. The upper surface of the reflector cup 110 is reflective so that some of the light emitted from the LED die 102 that impinges on the reflector cup can be reflected upward along the Z-axis. Thus, most of the light emitted from the LED die 102 can be directed in the Z-axis as useful output light. The angle of the reflector cup 110 with respect to the planar surface 202 of the leadframe 104 can be varied. However, the design of the leadframes 104 and 106 enables the angle of the reflector cup 110 with respect to the planar surface 202 of the leadframe 104 to be approximately forty-five degrees (45°), which would help reflect more light from the LED die 102 and increase the light output of the LED package 100. As shown in FIG. 1, the reflector cup 110 includes an opening 116 in which a portion of the planar surface 216 of the leadframe 106 is exposed so that the bond wire 108 can be electrically connected to the planar surface 216 of the leadframe 106.

The LED die 102 mounted on the planar surface 202 of the leadframe 104 within the reflector cup 110 is encapsulated by the encapsulant 114, as illustrated in FIGS. 4 and 5. The encapsulant 114 is made of an optically transparent substance so that light from the LED die 102 can travel through the encapsulant and be emitted as output light. As an example, the encapsulant 114 can be made of polymer (formed from liquid or semisolid precursor material such as monomer), epoxy, silicone, glass or a hybrid of silicone and epoxy.

The structural body 112 of the LED package 100 holds the leadframes 104 and 106, and the reflector cup 110 together. Thus, the structural body 112 provides structural integrity for the LED package 110. The structural body 112 may be made of an electrically insulating material, such as plastic. In an embodiment, the reflector cup 110 is an integrated component of the structural body 112. That is, the reflector cup 110 is formed on the structural body 112.

In operation, as illustrated in FIG. 4, the wing-like extensions 204 and 206 of the leadframe 104 provide heat paths 408 and 410 from the LED die 102 to the PCB 400 through the pads 402 and 404 of the PCB, which are thermally connected to the ends 208 and 210, respectively, of the wing-like extensions 204 and 206 of the leadframe 104. The pads 402 and 404 of the PCB 400 may lead to a heat sink (not shown). The heat paths 408 and 410 provided by the wing-like extensions 204 and 206 of the leadframe 104 direct the heat generated by the LED die 102 away from the LED die to the PCB 400 through each wing-like extension of the leadframe 104. Thus, the wing-like extensions 204 and 206 of the leadframe 104 operate to dissipate the heat generated by the LED die 102, allowing the LED die to function properly even when activated by a high driving current.

While the wing-like extensions 204 and 206 of the leadframe 104 provide the heat paths 408 and 410 from the LED die 102 to the PCB 400, the frontal extension 212 of the leadframe 104 provides a part of an electric path 512 from the pad 506 of the PCB 400 to the pad 514 of the PCB 400 through the LED die, as illustrated in FIG. 5. The frontal extension 212 of the leadframe 104 is electrically connected to the pad 506 of the PCB 400, while the leadframe 106 is electrically connected to a pad 514 of the PCB. The part of the electric path 512 provided by the frontal extension 212 of the leadframe 104 allows the driving current to flow from the pad 506 of the PCB 400 to the LED die 102. The remaining part of the electric path 512 is provided by the bond wire 108 and the leadframe 106, which allow the driving current to flow from the LED die 102 to the pad 514 on the PCB 400.

Figure 6:
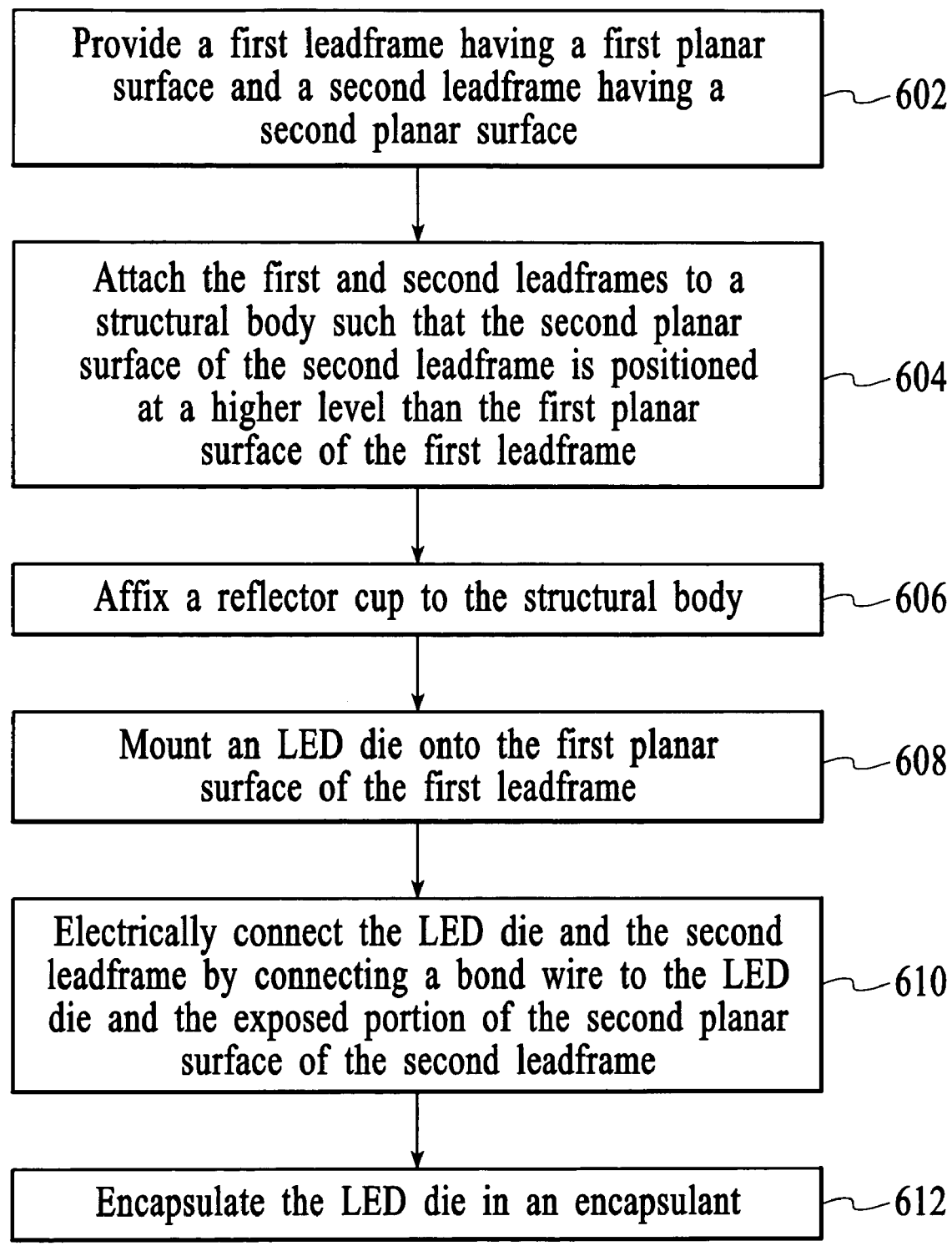
FIG. 6 is a process flow diagram of a method for making an LED package in accordance with an embodiment of the invention.

A method for making an LED package in accordance with an embodiment of the invention is described with reference to the process flow diagram of FIG. 6. At block 602, a first leadframe having a first planar surface and a second leadframe having a second planar surface are provided. The first leadframe includes a pair of wing-like extensions, which extend from the first planar surface and are bent such that ends of the wing-like extensions are positioned below the first planar surface. The first leadframe also includes a frontal extension, which extends from the first planar surface and is bent such that end of the frontal extension is positioned below the first planar surface. The second leadframe is bent such that end of the second leadframe is positioned below the second planar surface. Next, at block 604, the first and second leadframes are attached to a structural body such that the second planar surface of the second leadframe is positioned at a higher level than the first planar surface of the first leadframe. Next, at block 606, a reflector cup is affixed to the structural body such that the reflector cup is positioned over the first planar surface of the first leadframe. The reflector cup includes an opening in which a portion of the second planar surface of the second leadframe is exposed. Next, at block 608, the LED die is mounted onto the first planar surface of the first leadframe within the reflector cup. Alternatively, the LED die may be mounted onto the first planar surface of the first leadframe before the reflector cup is affixed to the structural body. Next, at block 610, the LED die and the second leadframe are electrically connected by connecting a bond wire to the LED die and the exposed portion of the second surface of the second leadframe. Next, at block 612, the LED die is encapsulated in an encapsulant.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A light emitting device package comprising:
   a first leadframe having a first surface;
   a light source mounted on said first surface of said first leadframe;
   a second leadframe having a second surface, said second surface being positioned at a higher level than said first surface; and
   an electrical connection between said light source and said second surface of said second leadframe,
   wherein said first leadframe includes a frontal extension that extends from said first surface, said frontal extension providing an electric path to said light source mounted on said first surface of said first leadframe, said first leadframe further including a pair of wing-like extensions that extend from said first surface, each of said wing-like extensions providing a heat path away from said light source mounted on said first surface of said first leadframe, said heat path provided by each of said wing-like extensions being a different path than said electric path provided by said frontal extension.

2. The light emitting device package of claim 1 wherein said light source includes a light emitting diode die.

3. The light emitting device package of claim 1 wherein said wing-like extensions are bent such that ends of said wing-like extensions are positioned below said first surface of said first leadframe.

4. The light emitting device package of claim 1 wherein said first surface of said first leadframe and said second surface of said second leadframe are substantially planar surfaces.

5. The light emitting device package of claim 1 wherein said electrical connection includes a bond wire connected to said light source and said second surface of said second leadframe.

6. The light emitting device package of claim 1 further comprising a reflector cup positioned over said first surface of said first leadframe, said reflector cup including an opening to expose a portion of said second surface of said second leadframe.

7. A method for making a light emitting device package, said method comprising:
   providing first and second leadframes, said first leadframe including a first surface, said second leadframe including a second surface;
   attaching the first and second leadframes to a structural body such that said second surface of said second leadframe is positioned at a higher level than said first surface of said first leadframe;
   mounting a light source onto said first surface of said first leadframe; and
   electrically connecting said light source to said second surface of said second leadframe,
   wherein said first leadframe includes a frontal extension that extends from said first surface, said frontal extension providing an electric path to said light source mounted on said first surface of said first leadframe, said first leadframe further including a pair of wing-like extensions that extend from said first surface, each of said wing-like extensions providing a heat path away from said light source mounted on said first surface of said first leadframe, said heat path provided by each of said wing-like extensions being a different path than said electric path provided by said frontal extension.

8. The method of claim 7 wherein said light source is a light emitting diode die.

9. The method of claim 7 further comprising affixing a reflector cup to said structural body such that said reflector cup is positioned over said first surface of said first leadframe, said reflector cup including an opening to expose a portion of said second surface of said second leadframe.

10. The method of claim 7 wherein said first surface of said first leadframe and said second surface of said second leadframe are substantially planar surfaces.

11. The method of claim 7 wherein said electrical connecting includes electrically connecting said light source to said second surface of said second leadframe using a bond wire.

12. A light emitting device package comprising:
   a structural body;
   a first leadframe having a first surface attached to said structural body;
   a light emitting diode die mounted on said first surface of said first leadframe;
   a second leadframe having a second surface attached to said structural body, said second surface being positioned at a higher level than said first surface of said first leadframe;
   a reflector cup positioned over said first surface of said first leadframe such that said light emitting diode die is positioned within said reflector cup, said reflector cup including an opening to expose a portion of said second surface of said second leadframe; and a bond wire connected to said light emitting diode die and said second surface of said second leadframe, wherein said first leadframe includes a frontal extension that extends from said first surface, said frontal extension providing an electric path to said light emitting diode die mounted on said first surface of said first leadframe, said first leadframe further including a pair of wing-like extensions that extend from said first surface, each of said wing-like extensions providing a heat path away from said light emitting diode die mounted on said first surface of said first leadframe, said heat path provided by each of said wing-like extensions being a different path than said electric path provided by said frontal extension.

13. The light emitting device package of claim 12 wherein said first surface of said first leadframe and said second surface of said second leadframe are substantially planar surfaces.

14. The light emitting device package of claim 12 wherein said structural body is made of a plastic material.

* * * * *